United States Patent
Whitman et al.

(10) Patent No.: US 6,642,155 B1
(45) Date of Patent: Nov. 4, 2003

(54) METHOD FOR APPLYING A FLUID TO A ROTATING SILICON WAFER SURFACE

(75) Inventors: John D. Whitman, Boise, ID (US); Jeff Johnson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 638 days.

(21) Appl. No.: 09/092,543

(22) Filed: Jun. 5, 1998

(51) Int. Cl.[7] .......................... H01L 21/31; C27C 14/28
(52) U.S. Cl. .......................... 438/758; 427/595
(58) Field of Search ................... 438/680, 782, 438/780, 758; 427/595, 240, 96

(56) References Cited

U.S. PATENT DOCUMENTS

| 5,001,084 A | * | 3/1991 | Kawawi et al. | 438/782 |
| 5,238,866 A | * | 8/1993 | Boltz et al. | 427/595 |
| 5,298,966 A | * | 3/1994 | Berman | 356/154 |
| 5,393,624 A | * | 2/1995 | Ushijima | 430/30 |
| 5,646,071 A | * | 7/1997 | Lin et al. | 427/96 |
| 5,658,615 A | * | 8/1997 | Hasebe et al. | 427/240 |
| 5,665,640 A | * | 9/1997 | Foster et al. | 438/680 |
| 5,763,329 A | * | 6/1998 | Kariya | 438/780 |
| 5,912,054 A | * | 6/1999 | Tateyama | 427/425 |
| 5,939,130 A | * | 8/1999 | Shiraishi et al. | 427/9 |
| 5,968,691 A | * | 10/1999 | Yoshioka et al. | 430/30 |

* cited by examiner

Primary Examiner—W. David Coleman
Assistant Examiner—Brook Kebede
(74) Attorney, Agent, or Firm—Trop, Pruner & Hu, P.C.

(57) ABSTRACT

A method and apparatus for applying conservative amounts of a fluid to coat a silicon wafer surface. The surface is rotated and the fluid is applied to the surface through multiple application ports. Centrifugal forces spread the fluid across the wafer surface.

4 Claims, 4 Drawing Sheets

METHOD FOR APPLYING A FLUID TO A ROTATING SILICON WAFER SURFACE

BACKGROUND OF THE INVENTION

Silicon wafers are chemically etched to form semiconductor circuits. As part of the etching process a chemical typically referred to as photoresist is uniformly applied to the surface of the silicon wafer. A mask is then interposed between the silicon wafer and an energy source such as a light projector. The energy source is applied through the mask and exposes the photoresist. The photoresist is then dissolved with developers, leaving a pattern which is used to etch an image upon the silicon wafer.

Typically, photoresist is applied to the silicon wafer through a nozzle located at the center of the wafer. The wafer is rotated and centrifugal force distributes the photoresist along the surface of the wafer. Photoresist is expensive and it is therefore desirable to avoid applying more photoresist to a wafer surface than is required to properly coat the surface.

SUMMARY OF THE INVENTION

The present invention may improve the efficiency of coating a silicon wafer with a fluid. In one embodiment, the fluid is applied at the center of the silicon wafer and at a point between the center of the silicon wafer and the silicon wafer's edge. In another embodiment, the progress of the fluid across the rotating wafer is monitored. The flow of the fluid is controlled such that excess fluid is not applied to the wafer. In yet another embodiment a first fluid application nozzle is located at the center of the silicon wafer. A second fluid application nozzle is interposed between the first application nozzle and the edge of the silicon wafer. A fluid is applied at the first nozzle and the wafer is rotated. As the photoresist progresses towards the edge of the silicon wafer, a sensor monitors the fluid progress and when the fluid reaches a predetermined point or radius, the flow of the fluid from the first nozzle is changed and the fluid is then dispensed through the second nozzle.

Another embodiment involves a method of applying fluid to a silicon wafer surface. A receiving surface is rotated about an axis. The receiving surface has an edge remote from the axis. A fluid is dispensed from a first nozzle onto the receiving surface at the axis from a first nozzle. Fluid is also dispensed onto the receiving surface from a second nozzle interposed between the first nozzle and the edge of the receiving surface.

Another embodiment involves an apparatus for uniformly coating a silicon wafer surface. A receiving surface is rotated about an axis. A first nozzle is positioned over the receiving surface proximate the axis. A second nozzle is over the receiving surface remote from the first nozzle.

In another embodiment, a method is disclosed for applying a fluid to a silicon wafer surface by rotating a receiving surface about an axis and dispensing a fluid onto a receiving surface proximate the axis. An energy stream is projected against the receiving surface. The energy reflected from the receiving surface is monitored to gather information about the receiving surface. The gathered information is used to then control the flow of the fluid to the receiving surface.

Another embodiment involves an apparatus for applying fluid to a silicon wafer surface. A receiving surface is rotatable about an axis. A nozzle is positioned over the receiving surface near the axis. An emitter projects an energy stream against the receiving surface. A receiver monitors the portion of the energy stream reflected from the receiving surface. A controller is in communication with the receiver. A conduit is in a fluid communication with the nozzle. A meter is disposed in the conduit. The meter is in communication with the controller and the meter is adapted to control the flow of the fluid through the conduit to the nozzle.

Another embodiment involves a method for applying fluid to a silicon wafer. A receiving surface is rotated about an axis. A fluid is dispensed from a first nozzle over the receiving surface proximate the axis onto the receiving surface. The outward flow of the fluid along the receiving surface is monitored and a fluid is dispensed from a second nozzle onto the receiving surface when the outward fluid flow reaches a predetermined radius from the axis.

In another embodiment, an apparatus for applying a fluid to a silicon wafer includes a receiving surface rotatable about an axis. The receiving surface has an exterior edge. A first conduit has a discharge orifice over the receiving surface near the receiving surface axis. The second conduit has a discharge orifice over the receiving surface between the axis and the exterior edge of the receiving surface. A first meter is adapted to control the flow of a fluid through the first conduit. A second meter is adapted to control the flow of the fluid through the second conduit. A monitor is adapted to detect the outward flow of the fluid along the receiving surface. A controller is in communication with the monitor and the meters and is adapted to control the meters.

In another embodiment a receiving surface is rotated about an axis and a fluid is dispensed onto the receiving surface at a first radius from the axis. The outward flow of the fluid is monitored and the fluid is dispensed from a second radius from the axis when the fluid dispensed at the first radius flows to a predetermined radius.

In yet another embodiment a method for coating a silicon wafer surface involves rotating a receiving surface about an axis. A fluid is dispensed onto the receiving surface at a first radius from the axis. The fluid is sensed at a second radius from the first axis. The flow of the fluid onto the receiving surface at the first radius from the axis is altered and the fluid is dispensed onto the receiving surface near the second radius.

DESCRIPTION OF THE PREFERRED EMBODIMENTS

Figure 1:
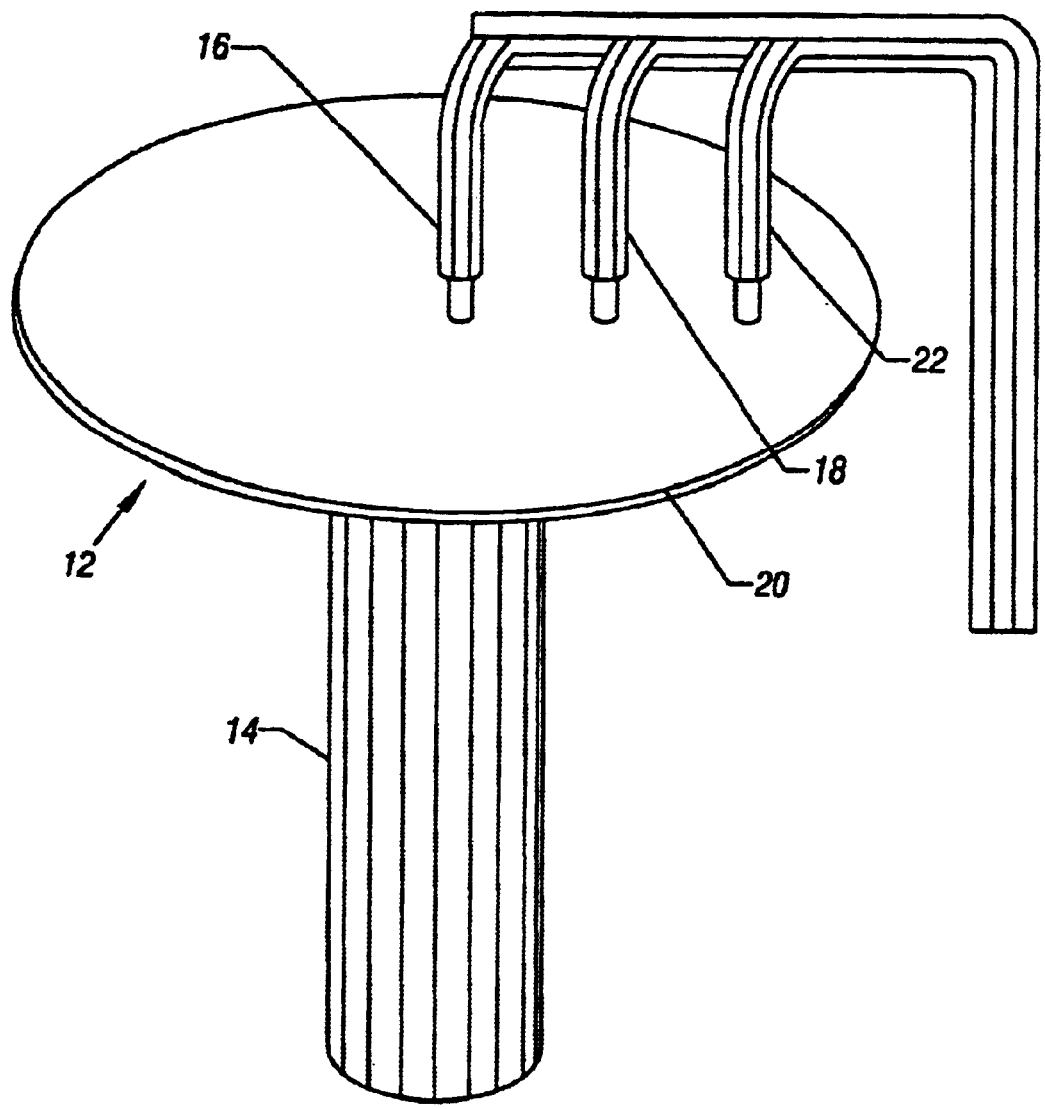
FIG. 1 is a perspective view of an embodiment of the present invention.

In FIG. 1, a silicon wafer 12 is mounted on a spindle 14. The spindle 14 is rotatable. A first nozzle 16 is adjacent the center of the silicon wafer 12. A second nozzle 18 is interposed between the first nozzle 16 and the edge 20 of the silicon wafer 12. A third nozzle 22 is interposed between the second nozzle 18 and the edge 20 of the silicon wafer 12. Flow of a fluid, such as photoresist, through the first, second, and third nozzles is independently controlled.

The fluid is first applied through the first nozzle 16. The silicon wafer 12 is rotated and centrifugal forces spread the fluid outwardly along the receiving surface of the wafer 12. After a predetermined time, the fluid flow from the first nozzle 16 may be stopped or decreased and the fluid may then be dispensed from the second nozzle 18. After a predetermined time, the fluid flow from the second nozzle 18 may be stopped or decreased and the fluid may then be dispensed from the third nozzle 22. The flow of fluid to the first, second, and third nozzles 16, 18, 22 may be stopped or ramped down as the subsequent nozzle flow begins or is ramped up so that the flow of fluid to the wafer 12 remains constant. This process provides an even and efficient distribution of a fluid, such as photoresist, across the surface of the silicon wafer 12.

For a twelve-inch diameter wafer, the first, second, and third nozzles 16, 18, 22 may be approximately two inches apart in one illustrative embodiment. In another illustrative embodiment, initially, photoresist may be applied to the silicon wafer 12 from the first nozzle 16 for 0.5 seconds. After the first 0.5 seconds of the process, 0.3 cc of photoresist may be dispensed from the second nozzle 18 for 0.5 seconds. After the first 1.0 seconds of the process, 0.3 cc of photoresist may then be flowed from the third nozzle 22 for 0.5 seconds. Thus, in this example, 1.1 cc. of photoresist is applied in 1.5 seconds.

Figure 2:
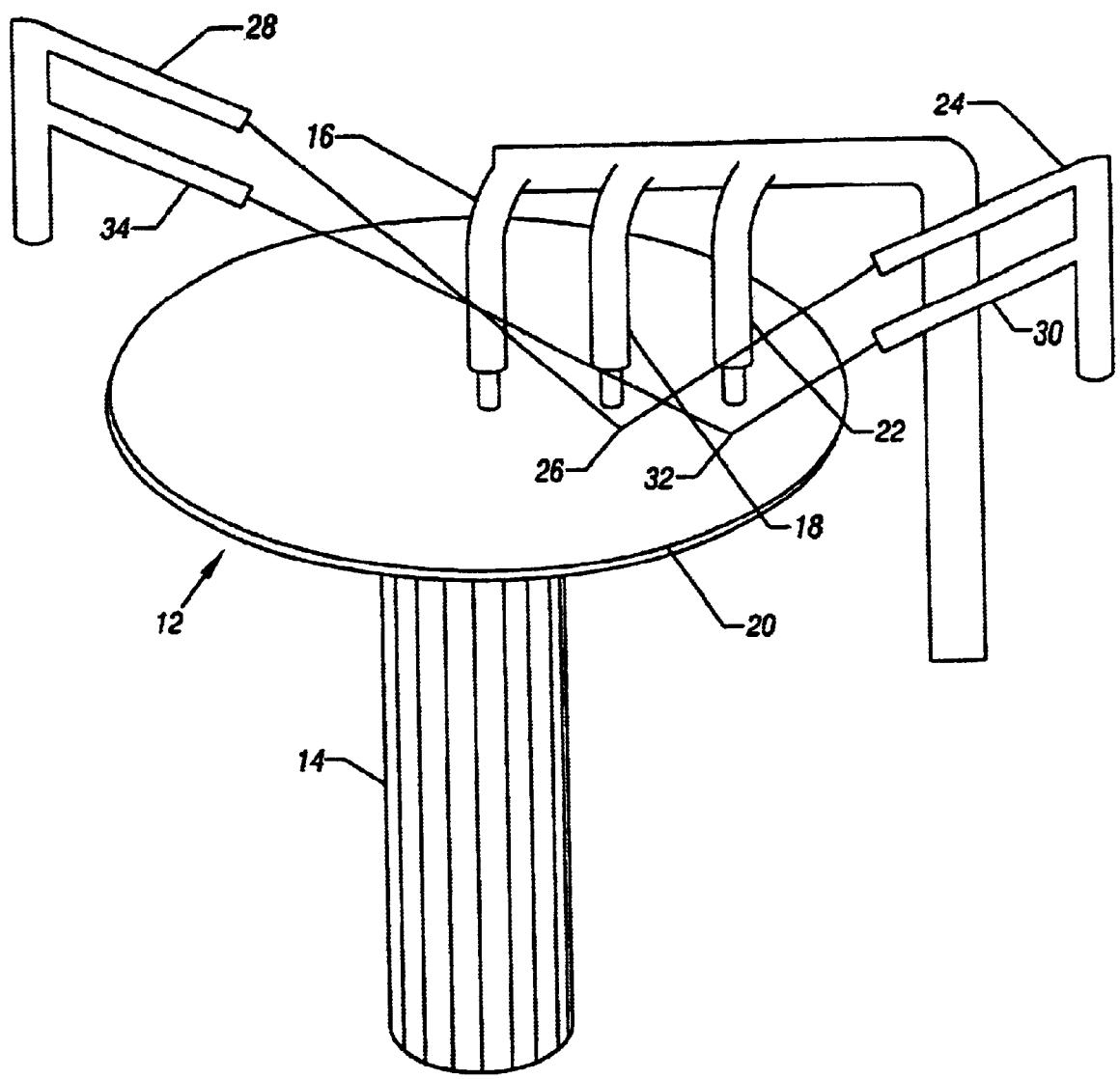
FIG. 2 is a perspective view of another embodiment of the present invention.

In an alternate embodiment shown in FIG. 2, a fluid is applied to the center of the silicon wafer through a first nozzle 16. The silicon wafer 12 is rotated on a spindle 14. A first energy source 24, such as an infrared or visible light emitter, projects energy to a first observation point 26 on the surface of the silicon wafer 12. A first receiver 28 monitors energy reflected from the first observation point 26. A second energy source 30 projects energy against the surface of the silicon wafer at a second observation point 32. A second receiver monitors 34 the energy reflected from the second observation point 32.

When the applied fluid is detected at the first observation point 26, for example, because of the effect of the fluid on surface reflectivity, the flow of fluid through the first nozzle 16 may be reduced or stopped. Fluid may then be dispensed from the second nozzle 18 until the fluid is detected at the second observation point 32. When the fluid is detected at the second observation point 32, the flow from the second nozzle 18 may be stopped or reduced and fluid may then be dispensed from the third nozzle 22 for a predetermined period. The first and second observation points 26, 32 may be at the same radius as the second and third nozzles 18, 22. Alternatively, it may be advantageous to position the observation points 26, 32 inward from the second and third nozzles 18, 22.

Figure 3:
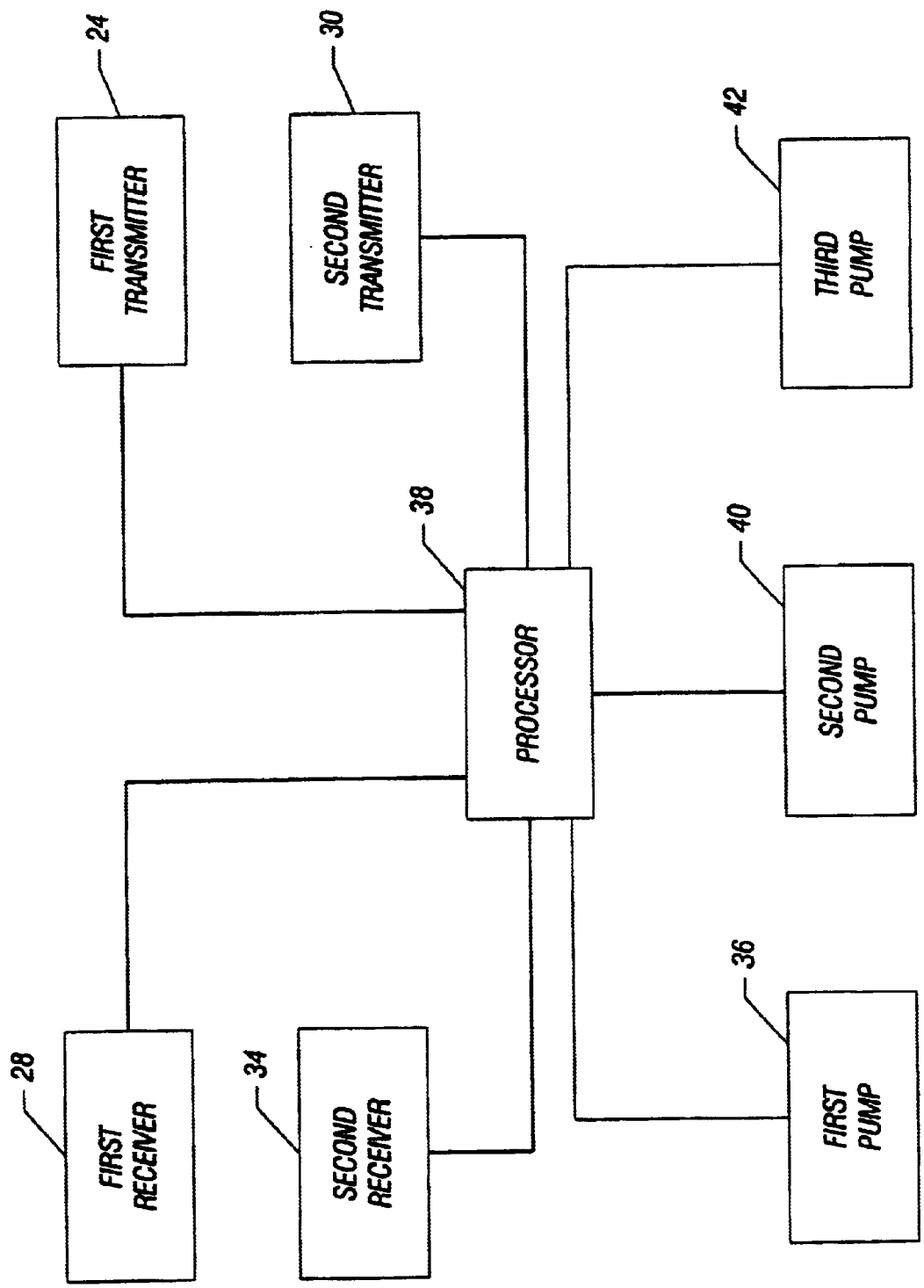
FIG. 3 is a schematic representation of an aspect of one embodiment of the present invention.

As shown in FIG. 3, fluid may be dispensed from the first nozzle 16 by activating the first pump 36. A processor 38 receives information from the first receiver 28 indicating the fluid has spread to the first observation point 26. The processor 38 can then deactivate the first pump 36 and activate the second pump 40 which dispenses photoresist through the second nozzle 18. When the processor 38 receives information from the second receiver 34 indicating the photoresist has spread to the second observation point 32, the processor 38 may deactivate the second pump 40 and activate the third pump 42 for a predetermined period.

Figure 4:
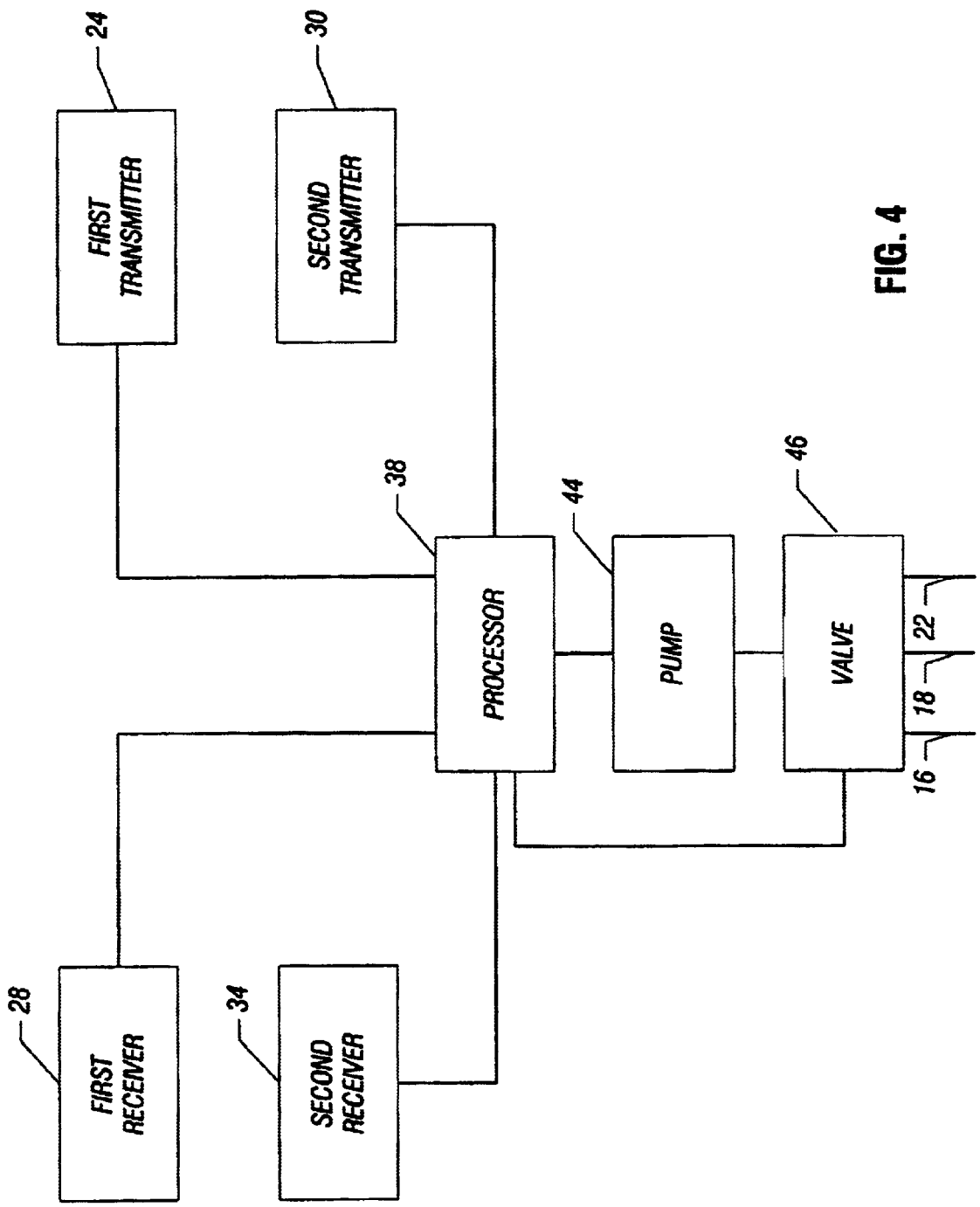
FIG. 4 is a schematic representation of an alternate embodiment of FIG. 3.

Alternatively, as shown in FIG. 4, fluid may be dispensed from the first nozzle 16 by activating the pump 44 and valve 46. A processor 38 receives information from the first receiver 28 indicating the fluid has spread to the first observation point 26. The processor 38 can then activate the nozzle 18 by controlling the valve 46. When the processor 38 receives information from the second receiver 34 indicating the photoresist has spread to the second observation point 32, the processor 38 may activate the valve 42 to disperse liquid from the nozzle 22 for a predetermined period.

The foregoing describes various embodiments of the claimed invention. The claimed invention is not limited to the embodiments described above. It is contemplated that numerous alternative constructors exist that would fall within the claimed invention.

What is claimed is:

1. A method for applying a fluid to a silicon wafer surface comprising:

rotating a receiving surface about an axis;

dispensing a fluid from a first nozzle adjacent said axis onto said receiving surface;

monitoring the outward flow of said fluid along said receiving surface; and dispensing said fluid from a second nozzle onto said receiving surface when said fluid flows outwardly to a radius from said axis, said second nozzle being remote from said first nozzle.

2. The method of claim 1 wherein said monitoring is achieved by measuring light reflected from said receiving surface.

3. The method of claim 1 wherein said fluid is photoresist.

4. A method of applying a fluid to a silicon wafer surface comprising:

rotating a receiving surface about an axis;

dispensing a fluid onto said receiving surface at a first radius from said axis;

monitoring the outward flow of said fluid from said first radius; and dispensing said fluid onto said receiving surface at a second radius from said axis when said fluid dispensed at said first radius flows to a radius from said axis.

* * * * *